(12) United States Patent
Xiao et al.

(10) Patent No.: US 11,971,639 B2
(45) Date of Patent: Apr. 30, 2024

(54) ARRAY SUBSTRATE, MANUFACTURING METHOD THEREOF, AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Bangqing Xiao, Shenzhen (CN); Sen Xu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 484 days.

(21) Appl. No.: 17/252,232

(22) PCT Filed: Oct. 29, 2020

(86) PCT No.: PCT/CN2020/124723
§ 371 (c)(1),
(2) Date: Dec. 14, 2020

(87) PCT Pub. No.: WO2022/052243
PCT Pub. Date: Mar. 17, 2022

(65) Prior Publication Data
US 2022/0317501 A1 Oct. 6, 2022

(30) Foreign Application Priority Data

Sep. 10, 2020 (CN) .......................... 202010944971.7

(51) Int. Cl.
*G02F 1/1362* (2006.01)
*G02F 1/1335* (2006.01)
(Continued)

(52) U.S. Cl.
CPC .... *G02F 1/13629* (2021.01); *G02F 1/133512* (2013.01); *G02F 1/136222* (2021.01);
(Continued)

(58) Field of Classification Search
CPC ........... G02F 1/13629; G02F 1/133512; G02F 1/136222; G02F 1/1368; H01L 27/124; H01L 27/1262
See application file for complete search history.

(56) References Cited

U.S. PATENT DOCUMENTS 10,484,577 B1  11/2019  Zhang
2003/0136971 A1*  7/2003  Rhee ................ G02F 1/136227
                                          257/E29.291
(Continued)

FOREIGN PATENT DOCUMENTS

CN  106206430 A  12/2016
CN  106683631 A  5/2017
(Continued)

OTHER PUBLICATIONS

International Search Report in International application No. PCT/CN2020/124723, dated May 26, 2021.
(Continued)

*Primary Examiner* — James A Dudek
(74) *Attorney, Agent, or Firm* — PV IP PC; Wei Te Chung; Zhigang Ma

(57) ABSTRACT

The present disclosure provides an array substrate, including a display region, and the display region includes driving circuit regions. The array substrate includes a first substrate, a gate driver on array (GOA) circuit and a pixel driving circuit respectively disposed on opposite sides of the first substrate and located in the driving circuit regions. The GOA circuit is connected with the pixel driving circuit through a plurality of via holes, so wiring regions of the
(Continued)

GOA circuit and wiring regions of the pixel driving circuit can overlap in space, thereby reducing space occupied by a pixel display region and increasing a pixel aperture ratio.

18 Claims, 7 Drawing Sheets

(51) Int. Cl.
    *G02F 1/1368*    (2006.01)
    *H01L 27/12*     (2006.01)

(52) U.S. Cl.
    CPC .......... *G02F 1/1368* (2013.01); *H01L 27/124* (2013.01); *H01L 27/1262* (2013.01)

(56) References Cited

U.S. PATENT DOCUMENTS

| | | | |
|---|---|---|---|
| 2011/0018001 A1 | 1/2011 | Tsai | |
| 2015/0340419 A1* | 11/2015 | Li | ........................ H10K 59/123 |
| | | | 438/151 |
| 2016/0124259 A1* | 5/2016 | Kawata | ............... G02F 1/13458 |
| | | | 257/773 |
| 2017/0256217 A1 | 9/2017 | Xiao et al. | |
| 2017/0294496 A1* | 10/2017 | Wang | .................. H10K 59/1275 |
| 2018/0210265 A1* | 7/2018 | Wang | .................. G02F 1/13454 |
| 2019/0164855 A1 | 5/2019 | Hong et al. | |

FOREIGN PATENT DOCUMENTS

| | | |
|---|---|---|
| CN | 106773384 A | 5/2017 |
| CN | 106875911 A | 6/2017 |
| CN | 107248521 A | 10/2017 |
| CN | 107424554 A | 12/2017 |
| CN | 110010627 A | 7/2019 |
| CN | 110021279 A | 7/2019 |
| CN | 110047854 A | 7/2019 |
| CN | 110178174 A | 8/2019 |
| CN | 110581142 A | 12/2019 |
| CN | 111312190 A | 6/2020 |

OTHER PUBLICATIONS

Written Opinion of the International Search Authority in International application No. PCT/CN2020/124723, dated May 26, 2021.
Chinese Office Action issued in corresponding Chinese Patent Application No. 202010944971.7 dated Apr. 25, 2021, pp. 1-8.

* cited by examiner

ARRAY SUBSTRATE, MANUFACTURING METHOD THEREOF, AND DISPLAY PANEL

RELATED APPLICATIONS

This application is a Notional Phase of PCT Patent Application No. PCT/CN2020/124723 having international filing date of Oct. 29, 2020, which claims the benefit of priority of Chinese Patent Application No. 202010944971.7 filed on Sep. 10, 2020. The contents of the above applications are all incorporated by reference as if fully set forth herein in their entirety.

FIELD OF INVENTION

The present disclosure relates to the field of display technologies, and particularly relates to an array substrate, a manufacturing method thereof, and a display panel.

BACKGROUND OF INVENTION

In order to promote development of ultra-narrow bezels of liquid crystal display devices, part of a gate driver on array (GOA) circuit needs to be designed in a display region of panels; that is, partial GOA in active area (PGIA). In prior art, wiring methods of the GOA circuit may occupy space of the display region, resulting in a decrease in a pixel aperture ratio, especially for 8K products with extremely low pixel aperture ratios, applications of the PGIA cannot meet pixel transmittance requirements.

Therefore, GOA technologies in the prior art need to be improved.

Technical Problems

Embodiments of the present disclosure provide an array substrate, a manufacturing method thereof, and a display panel to solve technical problems that in the prior art, part of a GOA circuit is designed in a display region of panels, and a wiring method of the GOA circuit may occupy space of the display region, resulting in a decrease in a pixel aperture ratio, thereby affecting transmittance.

Technical Solutions

To solve the above problems, technical solutions provided by the present disclosure are as follows:

Embodiments of the present disclosure provide an array substrate including a display region, and the display region includes driving circuit regions. The array substrate includes a first substrate, a GOA circuit, and a pixel driving circuit. The first substrate includes a first side and a second side disposed opposite to each other, the GOA circuit is disposed on the first side of the first substrate and is located in the driving circuit regions, and the pixel driving circuit is disposed on the second side of the first substrate and is located in the driving circuit regions. wherein a plurality of via holes located in the driving circuit regions are defined in the first substrate, and the GOA circuit is connected with the pixel driving circuit through the plurality of via holes.

In an embodiment of the present disclosure, the GOA circuit includes a plurality of first thin film transistors distributed in an array.

In an embodiment of the present disclosure, the pixel driving circuit includes a plurality of second thin film transistors distributed in an array and a plurality of scan lines.

In an embodiment of the present disclosure, a source electrode or a drain electrode of each of the first thin film transistors is connected with one of the scan lines through one of the via holes.

In an embodiment of the present disclosure, each of the first thin film transistors and corresponding one of the second thin film transistors are stacked.

In an embodiment of the present disclosure, a color filter layer is disposed on a side of the pixel driving circuit away from the first substrate.

In an embodiment of the present disclosure, the array substrate further includes a pixel electrode, and the pixel electrode is disposed on a side of the color filter layer away from the first substrate.

Embodiments of the present disclosure further provide a display panel, including an array substrate, a color filter substrate, and a liquid crystal layer sandwiched between the array substrate and the color filter substrate. The array substrate includes a display region, and the display region includes driving circuit regions. The array substrate includes a first substrate, a GOA circuit, and a pixel driving circuit. The first substrate includes a first side and a second side disposed opposite to each other, the GOA circuit is disposed on the first side of the first substrate and is located in the driving circuit regions, and the pixel driving circuit is disposed on the second side of the first substrate and is located in the driving circuit regions. wherein a plurality of via holes located in the driving circuit regions are defined in the first substrate, and the GOA circuit is connected with the pixel driving circuit through the plurality of via holes.

In an embodiment of the present disclosure, the GOA circuit includes a plurality of first thin film transistors distributed in an array, and the pixel driving circuit includes a plurality of second thin film transistors distributed in an array and a plurality of scan lines.

In an embodiment of the present disclosure, a source electrode or a drain electrode of each of the first thin film transistors is connected with one of the scan lines through one of the via holes.

In an embodiment of the present disclosure, each of the first thin film transistors and corresponding one of the second thin film transistors are stacked.

In an embodiment of the present disclosure, a color filter layer is disposed on a side of the pixel driving circuit away from the first substrate, and the color filter substrate includes a black matrix and a common electrode.

Embodiments of the present disclosure further provide a manufacturing method of an array substrate, including following steps:

S10, providing a first substrate with a plurality of via holes, the first substrate including a display region, and the display region including driving circuit regions;

S20, forming a GOA circuit in the driving circuit regions on a first side of the first substrate; and S30, forming a pixel driving circuit in the driving circuit regions on a second side of the first substrate, wherein the first side is opposite to the second side, and the GOA circuit is connected to the pixel driving circuit through the plurality of via holes.

In an embodiment of the present disclosure, the S20 includes: forming a plurality of first thin film transistors distributed in an array on the first side.

In an embodiment of the present disclosure, the S30 includes: forming a plurality of second thin film transistors distributed in an array and a plurality of scan lines on the second side.

In an embodiment of the present disclosure, a source electrode or a drain electrode of each of the first thin film transistors is connected to one of the scan lines through one of the via holes.

In an embodiment of the present disclosure, each of the first thin film transistors and corresponding one of the second thin film transistors are stacked.

In an embodiment of the present disclosure, the manufacturing method further includes: forming a color filter layer on the pixel driving circuit, and forming a pixel electrode on the color filter layer.

Beneficial Effects

In embodiments of the present disclosure, a glass with via holes is used as a carrier, and the GOA circuit and the pixel driving circuit are respectively disposed on opposite sides of the glass with the via holes, so that wiring regions of the GOA circuit and wiring regions of the pixel driving circuit can overlap in space, reducing space occupied by a pixel display region, thereby increasing a pixel aperture ratio.

DETAILED DESCRIPTION OF EMBODIMENTS

The present disclosure provides an array substrate, a manufacturing method thereof, and a display panel. In order to make purposes, technical solutions, and effects of the present disclosure clearer, the present disclosure will be further described in detail below with reference to the accompanying drawings and embodiments. It should be understood that specific embodiments described herein are merely used to explain the present disclosure and are not intended to limit the present disclosure.

Figure 1:
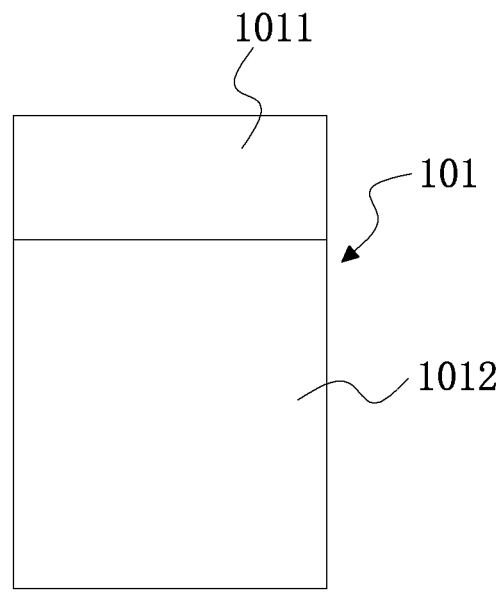
FIG. 1 is a schematic view of a display region of an array substrate provided by an embodiment of the present disclosure.
Figure 2:
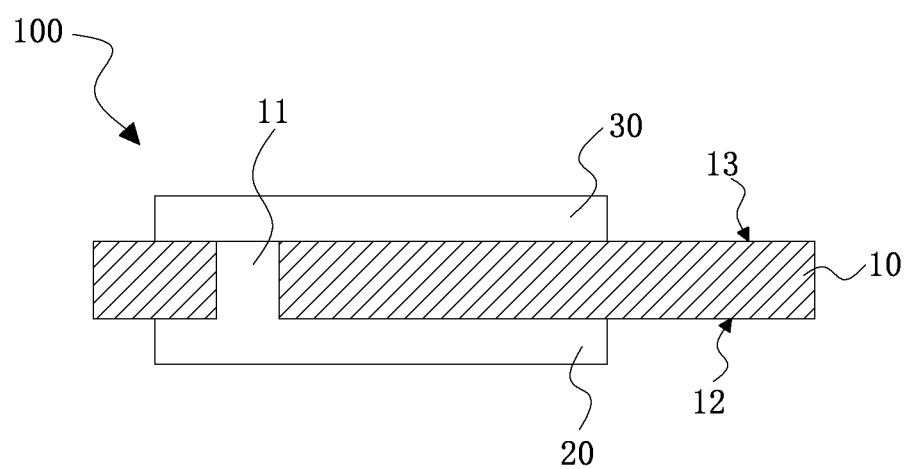
FIG. 2 is a schematic view of driving circuit regions of the array substrate provided by an embodiment of the present disclosure.

Referring to FIG. 1 and FIG. 2, an embodiment of the present disclosure provides an array substrate 100. The array substrate 100 includes a display region 101, and the display region 101 includes driving circuit regions 1011 and opening regions 1012. FIG. 1 only shows one of sub-pixel regions of the display region 101. The driving circuit regions 1011 are used to distribute metal devices and wires of driving circuits, and the opening regions 1012 refer to light-emitting regions of pixels.

The array substrate 100 includes a first substrate 10, a gate driver on array (GOA) circuit 20, and a pixel driving circuit 30, wherein the GOA circuit 20 and the pixel driving circuit 30 are respectively disposed on opposite sides of the first substrate 10, and the GOA circuit 20 and the pixel driving circuit 30 are both located in the driving circuit regions 1011.

A plurality of via holes 11 are defined in the first substrate 10, and the plurality of via holes 11 are located in the driving circuit regions 1011. The GOA circuit 20 is electrically connected with the pixel driving circuit 30 through the plurality of via holes 11, so as to transmit gate driving signals to the pixel driving circuit 30 to light up the pixels.

The pixel driving circuit 30 and the GOA circuit 20 are respectively disposed on front and back sides of the first substrate 10, so wiring regions of the pixel driving circuit 30 and wiring regions of the GOA circuit 20 can overlap in space, reducing space occupied by the opening regions 1012, thereby improving transmittance of the partial GOA in active area (PGIA) products.

Figure 3:
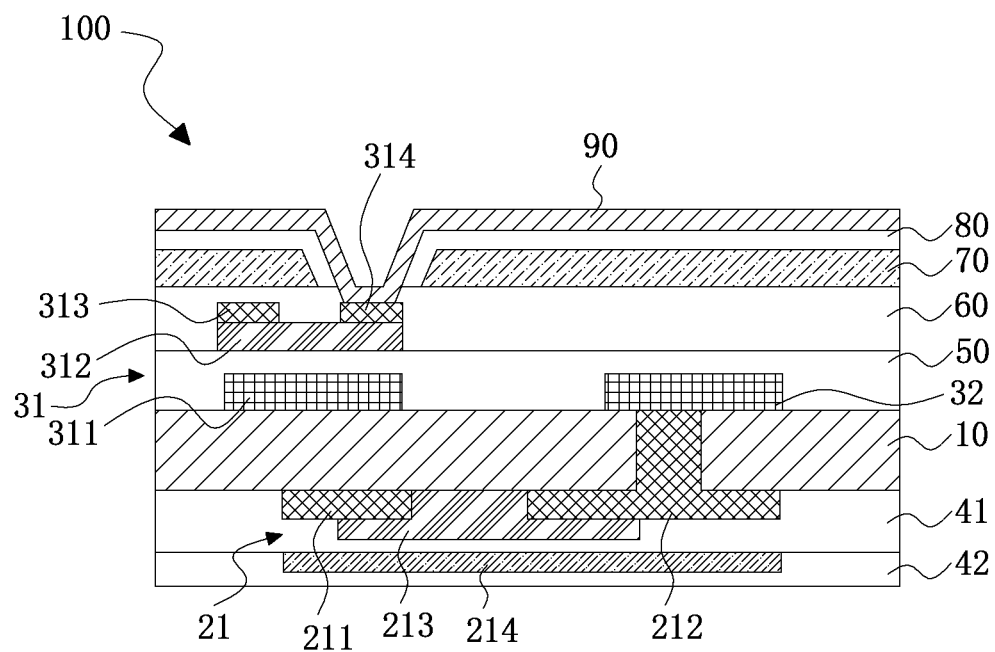
FIG. 3 is another schematic view of the driving circuit regions of the array substrate provided by an embodiment of the present disclosure.
Figure 4A:
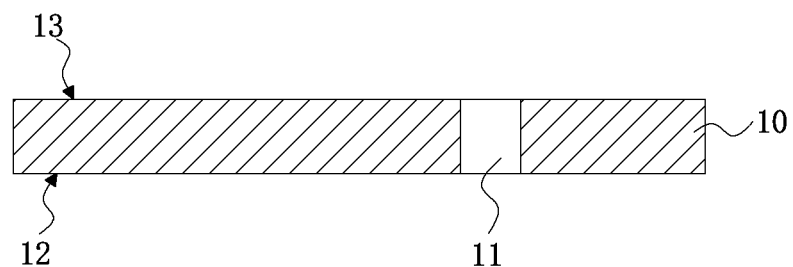
FIGS. 4A-4D are schematic views of a gate driver on array (GOA) circuit during preparation processes provided by an embodiment of the present disclosure.
Figure 4B:
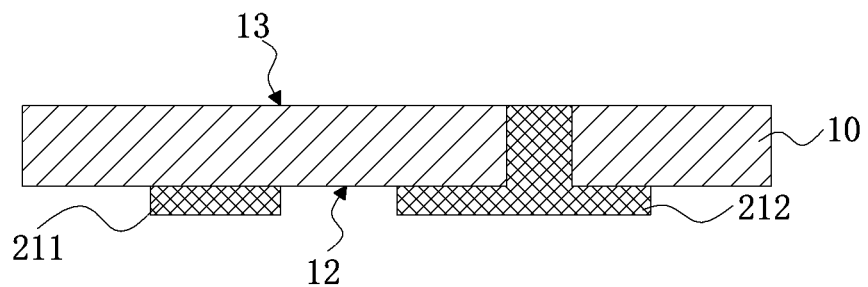
Figure 4C:
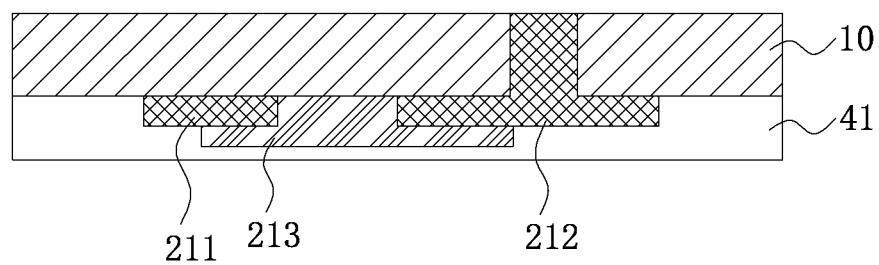
Figure 4D:
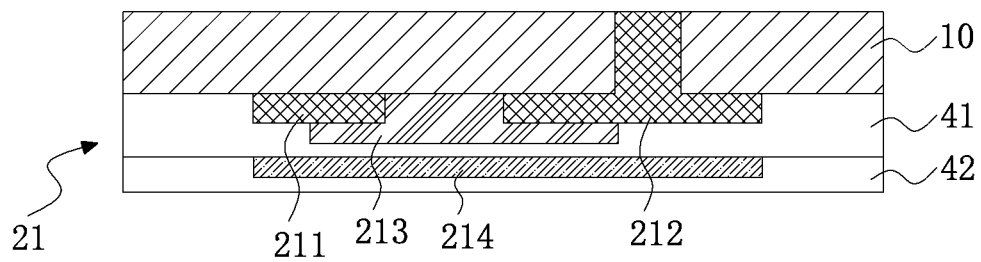
Figure 5A:
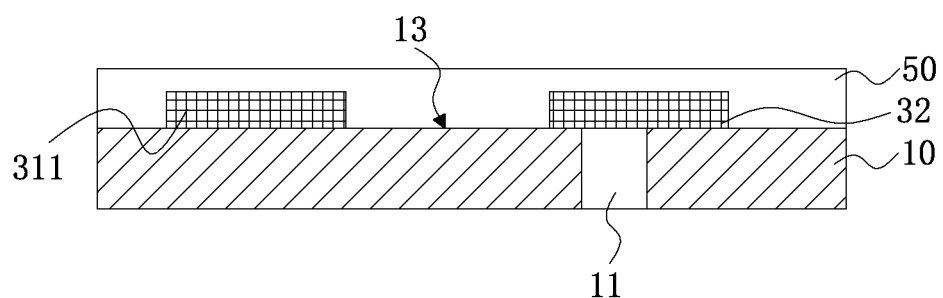
FIGS. 5A-5D are schematic views of a pixel driving circuit during preparation processes provided by an embodiment of the present disclosure.
Figure 5B:
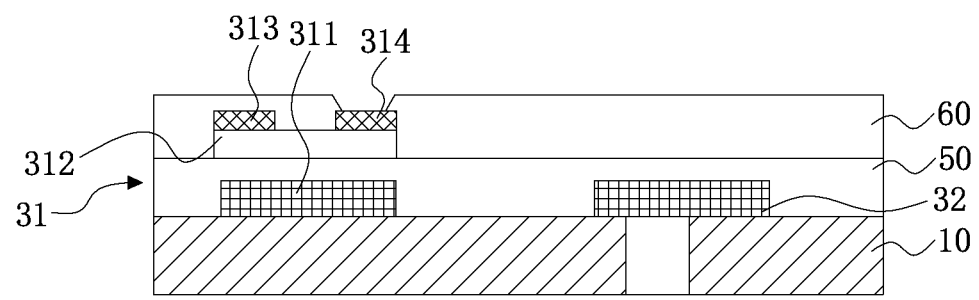
Figure 5C:
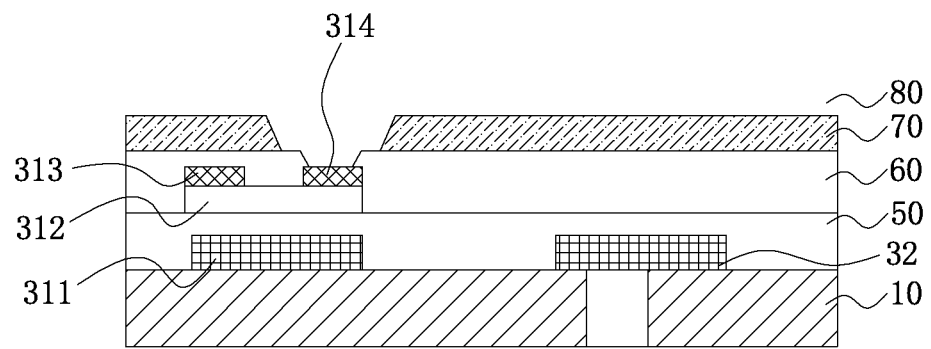
Figure 5D:
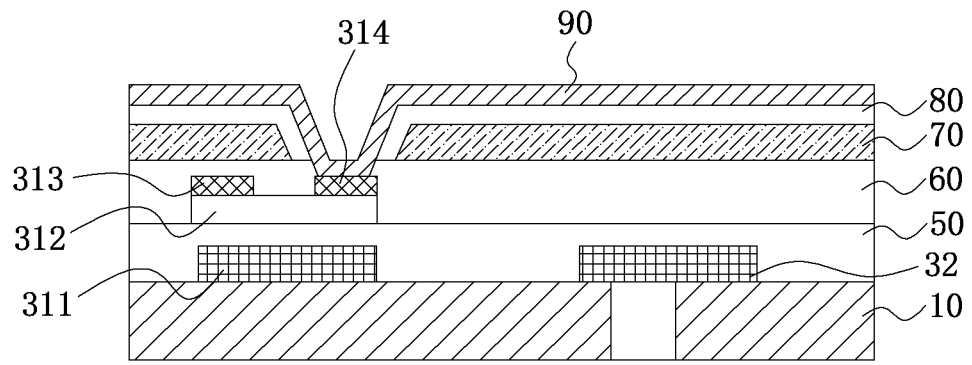

Referring to FIG. 3, in an embodiment, the GOA circuit 20 includes a plurality of first thin film transistors 21 distributed in an array. The pixel driving circuit 30 includes a plurality of second thin film transistors 31 distributed in an array and a plurality of scan lines 32.

The GOA circuit 20 includes a plurality of GOA driving units, and each of the GOA driving units is connected with one of the scan lines 32. Each of the GOA driving units includes at least one of the first thin film transistors 21, and each of the scan lines 32 is connected with one row of sub-pixels, so as to control the second thin film transistor 31 corresponding to the row of the sub-pixels to be turned on or off. Each of the GOA driving units transmits the driving signals to corresponding one of the scan lines 32 according to timing signals, thereby driving the row of the sub-pixels.

Specifically, a source electrode or a drain electrode of each of the first thin film transistors 21 is connected with one of the scan lines 32 through one of the via holes 11, wherein one of the scan lines 32 is connected with gate electrodes of the second thin film transistor 31 corresponding to one row of the sub-pixels, thereby controlling the second thin film transistor 31 to be turned on or off.

In an embodiment, each of the first thin film transistors 21 and a corresponding one of the second thin film transistors 31 may be stacked, thereby reducing space occupied of wires and increasing a pixel aperture ratio.

In an embodiment, the array substrate 100 may refer to a color filter on array (COA) substrate. The array substrate 100 includes a color filter layer 70. The color filter layer 70 is disposed on a side of the pixel driving circuit 30 away from the first substrate 10. Integrating the color filter layer 70 on the array substrate 100 can improve alignment accuracy during a subsequent alignment of upper and lower substrates.

In an embodiment, the array substrate 100 may further include a pixel electrode 90, and the pixel electrode 90 is disposed on a side of the color filter layer 70 away from the first substrate 10.

A planarization layer 80 is further disposed between the pixel electrode 90 and the color filter layer 70, and the planarization layer 80 may refer to an inorganic film layer or an organic film layer.

Referring to FIGS. 4A-4D, in an embodiment, each of the first thin film transistors 21 includes a first gate electrode 214, a first source electrode 211, a first drain electrode 212, and a first active layer 213.

Wherein, the first source electrode 211 and the first drain electrode 212 are disposed on a first side 12 (a back surface of the first substrate 10) of the first substrate 10, and the first active layer 213 is disposed on sides of the first source electrode 211 and the first drain electrode 212 away from the first substrate 10. Surfaces of the first active layer 213, the first source electrode 211, and the first drain electrode 212 are covered by an interlayer insulating layer 41. The first gate electrode 214 is disposed on a side of the interlayer insulating layer 41 away from the first substrate 10, and a surface of the interlayer insulating layer 41 is covered by a first gate insulating layer 42.

Referring to FIGS. 5A-5D, in an embodiment, each of the second thin film transistors 31 includes a second gate electrode 311, a second active layer 312, a second source electrode 313, and a second drain electrode 314.

Wherein, the second gate electrode 311 is disposed on a second side 13 (a front surface of the first substrate 10) of the first substrate 10. The scan lines 32 and the second gate electrode 311 may be disposed in a same layer.

The second gate electrode 311 is covered by a second gate insulating layer 50, a second active layer 312 is disposed on a side of the second gate insulating layer 50 away from the first substrate 10, and the second source electrode 313 and the second drain electrode 314 are disposed on a side of the second active layer 312 away from the first substrate 10.

The scan lines 32 are connected with lower first drain electrodes 212 through the via holes 11, or they may be connected with the first source electrodes 211.

The above-mentioned second thin film transistors 31 refer to bottom gate structures. In other embodiments, the second thin film transistors 31 may refer to top gate structures; that is, the second gate electrode 311 is disposed on the second active layer 312.

Figure 6:
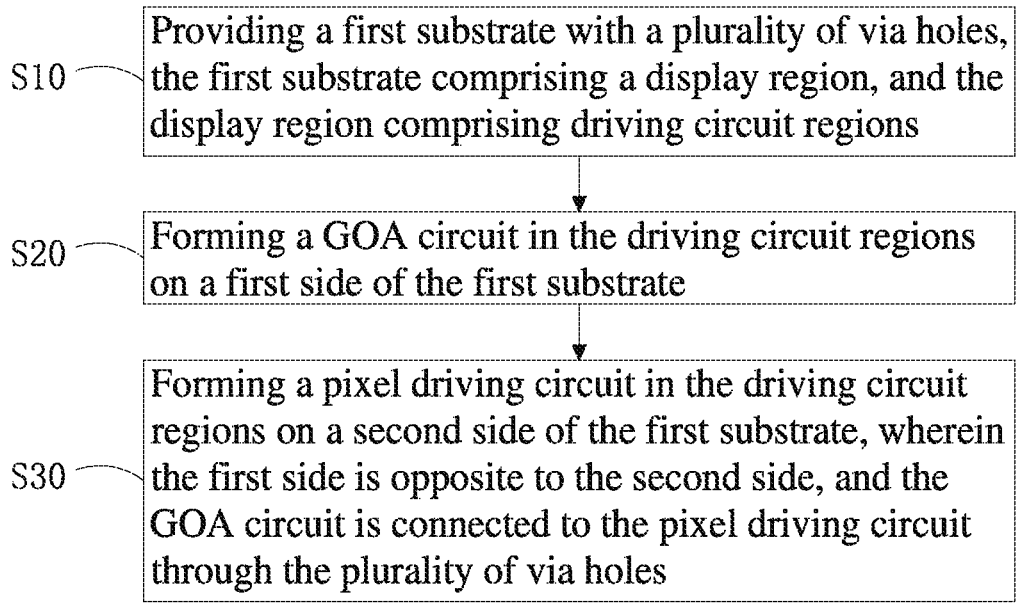
FIG. 6 is a schematic flowchart of steps of a manufacturing method of the array substrate provided by an embodiment of the present disclosure.

Referring to FIG. 6, embodiments of the present disclosure further provide a manufacturing method of the above-mentioned array substrate 100, including following steps:

S10, providing a first substrate 10 with a plurality of via holes 11, the first substrate 10 including a display region 101, and the display region 101 including driving circuit regions 1011;

S20, forming a GOA circuit 20 in the driving circuit regions 1011 on a first side 12 of the first substrate 10; and S30, forming a pixel driving circuit 30 in the driving circuit regions 1011 on a second side 13 of the first substrate 10, wherein the first side 12 is opposite to the second side 13, and the GOA circuit 20 is connected to the pixel driving circuit 30 through the plurality of via holes 11.

The first substrate 10 may refer to a glass substrate or other materials.

Referring to FIGS. 4A-4D, the S20 specifically includes: forming a plurality of first thin film transistors 21 distributed in an array on the first side 12.

Specifically, a first metal layer is deposited on the first side 12 firstly, and the first metal layer is processed by a patterning process to form a first source electrode 211 and a first drain electrode 212 in corresponding places, so one of the first source electrode 211 and the first drain electrode 212 can be disposed at the via holes 11, so the first source electrode 211 or the first drain electrode 212 can be electrically connected to upper scan lines 32.

Then, semiconductor materials are deposited on the first source electrode 211 and the first drain electrode 212, and after a patterning process, a first active layer 213 is formed. the semiconductor materials may be amorphous silicon or metal oxide, etc. There is no restriction herein.

After that, insulating materials are deposited on the first active layer to form an interlayer insulating layer 41. Then a second metal layer is deposited on the interlayer insulating layer 41 and patterned to form a first gate electrode 214.

Lastly, insulating materials are deposited on the first gate electrode 214 to form a first gate insulating layer 42.

The GOA circuit 20 further includes capacitors and surrounding wires, the capacitors and the surrounding wires can be prepared using the first metal layer or the second metal layer.

Referring to FIGS. 5A-5D, the S30 includes: forming a plurality of second thin film transistors 31 distributed in an array and a plurality of scan lines 32 on the second side 13.

Specifically, a third metal layer is deposited on the second side 13 and patterned to form the second gate 311.

In an embodiment, the plurality of scan lines 32 and the second gate 311 may be disposed in a same layer; that is, the third metal layer may be etched to form patterns of the scan lines 32 in corresponding positions. Each of the scan lines 32 may correspond to one of the via holes 11, and the scan lines 32 are disposed at the via holes 11 to establish a connection with the GOA circuit below.

Insulating materials are further deposited on the second gate 311 to form a second gate insulating layer 50. Then, semiconductor materials are deposited on the second gate insulating layer 50 and patterned to form a second active layer 312. After that, a fourth metal layer is deposited on the second active layer 312 and patterned to form a second source electrode 313 and a second drain electrode 314. An interlayer insulating layer may also be de deposited between the second source electrode 313, the second drain electrode 314, and the second active layer 312.

The pixel driving circuit 30 may further include a plurality of data lines, and the plurality of data lines and the plurality of scan lines are interlaced with each other to define a plurality of sub-pixel regions. The data lines may be disposed in a same layer as the second source electrode 313 and the second drain electrode 314. That is, the fourth metal layer may be etched to form the data lines in corresponding places.

The manufacturing method further includes: forming a color filter layer 70 on the pixel driving circuit 30 and forming a pixel electrode 90 on the color filter layer 70.

Specifically, a passivation layer 60 is prepared on the second source electrode 313 and the second drain electrode 314, and the passivation layer 60 is used to protect thin film transistor devices.

After that, the color filter layer 70 may be prepared on the passivation layer 60, a planarization layer 80 is prepared on the color filter layer 70, and then the pixel electrode 90 is prepared on the planarization layer 80.

Via holes are defined in the passivation layer 60 and the color filter layer 70 to expose a part of a surface of the second drain electrode 314, and the pixel electrode 90 is connected to the second drain electrode 314 through the via holes. In other embodiments, the via holes may be defined upon the second source electrode 313, and the pixel electrode 90 is connected to the second source electrode 313.

Figure 7:
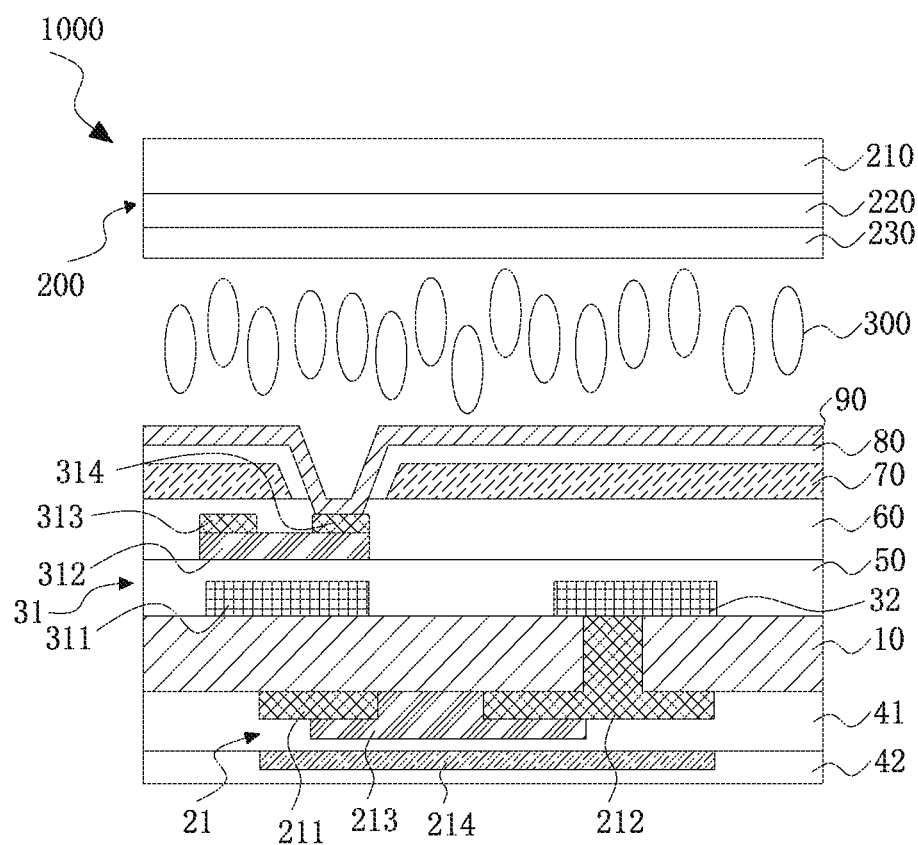
FIG. 7 is a schematic view of a display panel provided by an embodiment of the present disclosure.

Referring to FIG. 7, embodiments of the present disclosure further provide a display panel 1000, including a color filter substrate 200, an array substrate 100 described in any of the foregoing embodiments, and a liquid crystal layer 300 sandwiched between the array substrate 100 and the color filter substrate 200.

For structures of the array substrate 100, reference may be made to the descriptions of the array substrate 100 in the foregoing embodiments, which will not be repeated herein.

The color filter substrate 200 includes a second substrate 210, black matrixes 220 disposed on a side of the second substrate 210 facing the array substrate 100, and a common electrode 230 disposed on a side of the black matrixes 220 facing the array substrate 100. The black matrixes 220 correspond to the driving circuit regions 1011, and the black matrixes 220 cover the driving circuit regions 1011 to block light. The common electrode 230 may be disposed on an entire surface to cover the second substrate 210.

In an embodiment, when the array substrate 100 refers to a COA array substrate; that is, the color filter layer 70 is integrated onto the array substrate 100, color resists may not be provided on the color filter substrate 200, but the black matrixes 220 and the common electrode 230 are provided.

In other embodiments, when the color filter layer 70 is not integrated onto the array substrate 100, the color filter substrate 200 needs to include the color resists, and each of the color resists is disposed between adjacent black matrixes 220.

In embodiments of the present disclosure, glass with via holes is used as a carrier, and the GOA circuit and the pixel driving circuit are respectively disposed on opposite sides of the glass with the via holes, so wiring regions of the GOA circuit and wiring regions of the pixel driving circuit can overlap in space, thereby reducing space occupied by a pixel display region and increasing a pixel aperture ratio.

In the foregoing embodiments, the descriptions of the embodiments have their respective focuses. For a part that is not described in detail in an embodiment, reference may be made to related descriptions in other embodiments.

It can be understood that, for those skilled in the art, equivalent replacements and modifications can be made according to the technical solutions and disclosure ideas thereof of the present disclosure, and all these modifications or replacements are considered within the protection scope of the attached claims of the present disclosure.

What is claimed is:

1. An array substrate, comprising a display region comprising driving circuit regions and light emitting regions of pixels, and further comprising:
    a first substrate comprising a first side and a second side disposed opposite to each other;
    a gate driver on array (GOA) circuit disposed on the first side of the first substrate and located in the driving circuit regions; and
    a pixel driving circuit disposed on the second side of the first substrate and located in the driving circuit regions,
    wherein a plurality of via holes located in the driving circuit regions are defined in the first substrate, and the GOA circuit is connected with the pixel driving circuit through the plurality of via holes; and
    wherein the driving circuit regions are non-luminous regions of the display region and are nonoverlapped with the light emitting regions.

2. The array substrate of claim 1, wherein the GOA circuit comprises a plurality of first thin film transistors distributed in an array.

3. The array substrate of claim 2, wherein the pixel driving circuit comprises a plurality of second thin film transistors distributed in an array and a plurality of scan lines.

4. The array substrate of claim 3, wherein a source electrode or a drain electrode of each of the first thin film transistors is connected with one of the scan lines through one of the via holes.

5. The array substrate of claim 3, wherein each of the first thin film transistors and a corresponding one of the second thin film transistors are stacked.

6. The array substrate of claim 1, wherein a color filter layer is disposed on a side of the pixel driving circuit away from the first substrate.

7. The array substrate of claim 6, wherein the array substrate further comprises a pixel electrode disposed on a side of the color filter layer away from the first substrate.

8. A display panel, comprising an array substrate, a color filter substrate, and a liquid crystal layer sandwiched between the array substrate and the color filter substrate; and the array substrate comprising a display region comprising driving circuit regions and light emitting regions of pixels,
    wherein the array substrate comprises:
        a first substrate comprising a first side and a second side disposed opposite to each other, and the second side facing the color filter substrate;
        a GOA circuit disposed on the first side of the first substrate and located in the driving circuit regions; and
        a pixel driving circuit disposed on the second side of the first substrate and located in the driving circuit regions;
        wherein a plurality of via holes located in the driving circuit regions are defined in the first substrate, and the GOA circuit is connected with the pixel driving circuit through the plurality of via holes; and
        wherein the driving circuit regions are non-luminous regions of the display region and are nonoverlapped with the light emitting regions.

9. The display panel of claim 8, wherein the GOA circuit comprises a plurality of first thin film transistors distributed in an array, a plurality of second thin film transistors distributed in an array, and a plurality of scan lines.

10. The display panel of claim 9, wherein a source electrode or a drain electrode of each of the first thin film transistors is connected with one of the scan lines through one of the via holes.

11. The display panel of claim 9, wherein each of the first thin film transistors and a corresponding one of the second thin film transistors are stacked.

12. The display panel of claim 8, wherein a color filter layer is disposed on a side of the pixel driving circuit away from the first substrate, and the color filter substrate comprises a black matrix and a common electrode.

13. A manufacturing method of an array substrate, comprising following steps:
    S10, providing a first substrate with a plurality of via holes, wherein the first substrate comprises a display region comprising driving circuit regions and light emitting regions of pixels and the driving circuit regions are non-luminous regions of the display region and are nonoverlapped with the light emitting regions;
    S20, forming a GOA circuit in the driving circuit regions on a first side of the first substrate; and
    S30, forming a pixel driving circuit in the driving circuit regions on a second side of the first substrate, wherein the first side is opposite to the second side, and the GOA circuit is connected to the pixel driving circuit through the plurality of via holes.

14. The manufacturing method of claim 13, wherein the S20 further comprises:
    forming a plurality of first thin film transistors distributed in an array on the first side.

15. The manufacturing method of claim 14, wherein the S30 further comprises:
    forming a plurality of second thin film transistors distributed in an array and a plurality of scan lines on the second side.

16. The manufacturing method of claim 15, wherein a source electrode or a drain electrode of each of the first thin film transistors is connected to one of the scan lines through one of the via holes.

17. The manufacturing method of claim 13, wherein each of the first thin film transistors and a corresponding one of the second thin film transistors are stacked.

18. The manufacturing method of claim 13, wherein the manufacturing method further comprises:
   forming a color filter layer on the pixel driving circuit; and
   forming a pixel electrode on the color filter layer.

\* \* \* \* \*